United States Patent [19]

Hijikata et al.

[11] Patent Number: 5,006,220

[45] Date of Patent: Apr. 9, 1991

[54] ELECTRODE FOR USE IN THE TREATMENT OF AN OBJECT IN A PLASMA

[75] Inventors: Isamu Hijikata; Akira Uehara; Mitsuo Samezawa, all of Kanagawa, Japan

[73] Assignee: Tokyo Ohka Kogyo Co., Ltd., Kanagawa, Japan

[21] Appl. No.: 479,988

[22] Filed: Feb. 14, 1990

Related U.S. Application Data

[62] Division of Ser. No. 262,531, Oct. 25, 1988.

[30] Foreign Application Priority Data

Oct. 26, 1987 [JP] Japan .................. 62-164365

[51] Int. Cl.⁵ .................. H01H 1/46; C23F 4/04; B01J 19/12
[52] U.S. Cl. .................. 204/298.33; 156/345; 118/723
[58] Field of Search ....... 204/298 E, 298 EG, 298.33; 156/345; 118/723; 422/186.04, 186.05; 219/121.43; 315/111.41

[56] References Cited

U.S. PATENT DOCUMENTS

| | | | |
|---|---|---|---|
| 4,318,767 | 3/1982 | Hijikata et al. | 156/345 |
| 4,336,438 | 6/1982 | Uehara et al. | 219/123.43 |
| 4,424,096 | 1/1984 | Kumagai | 156/643 |
| 4,780,169 | 10/1988 | Stark et al. | 156/345 |

FOREIGN PATENT DOCUMENTS

| | | | |
|---|---|---|---|
| 52-142971 | 11/1977 | Japan | 156/345 |
| 59-4028 | 1/1984 | Japan | 156/345 |
| 61-214525 | 9/1986 | Japan | 118/723 |
| 62-109317 | 5/1987 | Japan | 156/345 |
| 63-3138 | 1/1988 | Japan | 156/345 |

*Primary Examiner*—Aaron Weisstuch
*Attorney, Agent, or Firm*—Irving M. Weiner; Joseph P. Carrier; Pamela S. Burt

[57] ABSTRACT

An electrode for use in the treatment of an object such as a semiconductor wafer through plasma reaction has at least a surface layer formed of silicon carbide. The electrode comprises a base, and the surface layer of silicon carbide is formed on a surface of the base by CVD coating process.

2 Claims, 1 Drawing Sheet

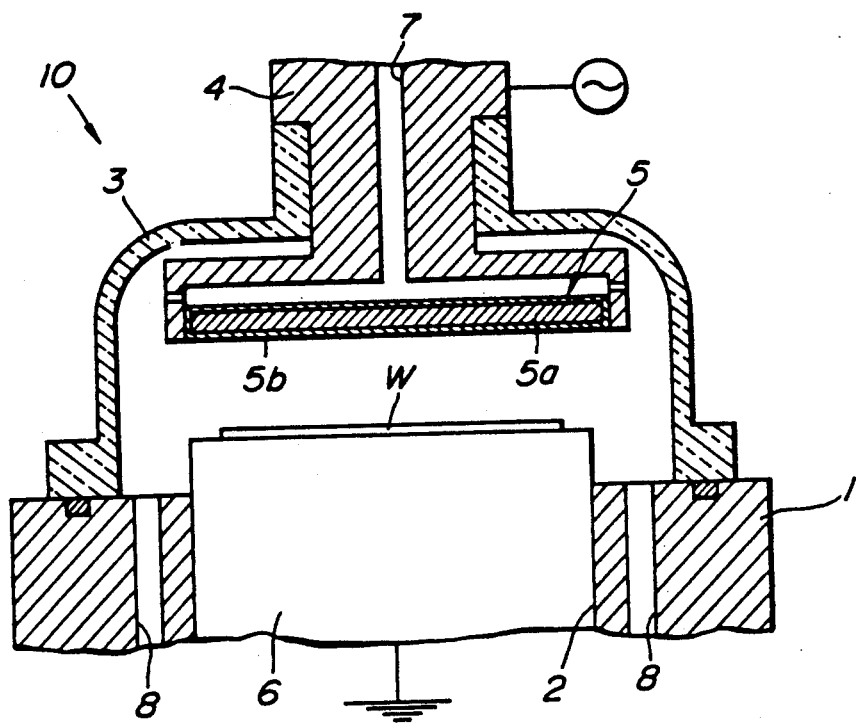
FIG.1
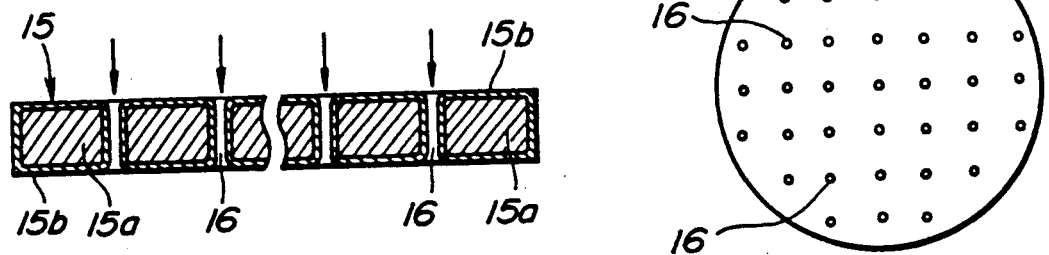
FIG.2
FIG.3

ELECTRODE FOR USE IN THE TREATMENT OF AN OBJECT IN A PLASMA

This is a division of application Ser. No. 07/262,531 filed Oct. 25,1988.

BACKGROUND OF THE INVENTION

1. Field of the Invention

The present invention relates to an electrode for use in the treatment of an object such as a semiconductor wafer or the like with a plasma treatment process such as plasma etching, plasma CVD (chemical vapor deposition), or the like.

2. Description of the Relevant Art

Known apparatus for treating an object such as a semiconductor wafer through plasma reaction have a hermetically sealed reaction chamber in which a pair of vertically spaced electrodes is disposed, as disclosed in U.S. Pat. Nos. 4,318,767 and 4,336,438. The object to be treated is placed on the lower electrode, and then the reaction chamber is evacuated, followed by introduction of a reaction gas into the reaction chamber. Then, a high-frequency voltage is applied between the electrodes to generate a plasma in the chamber for etching a film of $SiO_2$, for example, coated on the surface of the object.

Electrodes employed in such conventional plasma treatment apparatus are made of a metallic material such as an aluminum alloy, stainless steel, or the like. Japanese Laid-Open Patent Publication No. 52-142971 discloses an electrode made of carbon. Another electrode disclosed in Japanese Laid-Open Utility Model Publication No. 63-3138 is made of sintered aluminum powder.

Known metallic electrodes used in the plasma treatment apparatus are, however, disadvantageous in that the metallic material of the electrode is etched or sputtered by the plasma, and atoms emitted from the electrode tend to be attached to the surface of the object, thus contaminating the same. The known carbon electrode also has problems in that the electrode surface is modified and made less durable by a plasma discharge. Also, the plasma discharge scatters around minute particle of the carbon electrode which are likewise responsible for the contamination of the object. The contamination of the object with the electrode material may be prevented by coating the electrode surface with a layer of quartz. However, quartz produces oxygen when etched, and the oxygen is apt to have an adverse effect on the plasma treatment process.

SUMMARY OF THE INVENTION

It is an object of the present invention to provide an electrode for use in the treatment of an object through plasma reaction, which electrode is prevented from being modified and etched away to contaminate the object, and is highly durable.

To achieve the above object, an electrode according to the present invention is made in its entirety of SiC, or comprises a base made of carbon and coated on its surface with a film of SiC by a CVD coating process, e.g., an epitaxial growth process.

Since at least the surface layer of the electrode is made of highly pure SiC, the electrode surface is prevented from being modified or etched by a plasma produced in a reaction chamber of a plasma treatment apparatus. Therefore, the object in the reaction chamber is not contaminated with the electrode material.

The above and further objects, details and advantages of the present invention will become apparent from the following detailed description of a preferred embodiment thereof, when read in conjunction with the accompanying drawings.

BRIEF DESCRIPTION OF THE DRAWINGS

FIG. 1 is a fragmentary vertical cross-sectional view of an apparatus for treating an object in a plasma, the apparatus incorporating an electrode according to an embodiment of the present invention;

FIG. 2 is a fragmentary vertical cross-sectional view of an electrode according to another embodiment of the present invention; and FIG. 3 is a plan view of the electrode shown in FIG. 2.

DETAILED DESCRIPTION OF THE PREFERRED EMBODIMENTS

A shown in FIG. 1, an apparatus 10 for use in the treatment of an object such as a semiconductor wafer through plasma reaction comprises a table 1, a casing 3 mounted on the table 1, a holder 4 supported on the casing 3, and upper and lower electrodes 5, 6 disposed in the casing 3. The casing 3 which is made of quartz is fixed to the table 1 in surrounding relation to an opening 2 defined vertically in the table 1. The holder 4 made of an electrically conductive material and electrically connected to a high-frequency power supply is disposed on an upper portion of the casing 3 and extends into the casing 3. The upper electrode 5 is held by the lower end of the holder 4. The lower electrode 6 that is grounded is inserted, from below, in the opening 2. An object W to be treated, such as a semiconductor wafer or the like, is placed on the upper surface of the lower electrode 6.

The holder 4 has a gas inlet hole 7 defined vertically therethrough for introducing a reaction gas into the reaction chamber in the casing 3. The table 1 has discharge passages 8 defined vertically through for evacuating the reaction chamber.

The upper electrode 5 comprises a disc-shaped base 5a made of carbon which is coated on its surface with a film 5b of SiC that is deposited up to a thickness ranging from several tens to several hundreds $\mu m$ by a CVD coating process such as an epitaxial growth process. The upper electrode 5 may however be made of SiC in its entirety.

In operation, a high-frequency voltage is applied between the upper and lower electrodes 5, 6 to produce a plasma in the reaction chamber, thus etching a film coated on the surface of the object W.

An upper electrode according to another embodiment of the present invention will be described with reference to FIGS. 2 and 3. In this embodiment, an electrode 15 comprises a disc-shaped base 15a having a multiplicity of through holes 16 each having a diameter of 1 mm or less. The holes 16 are uniformly spaced such that the spacing between, two adjacent holes 16 is 20 mm or less. The through holes 16 axially extend so as to be directed toward the object W when the electrode 15 is set in the plasma treatment apparatus. Therefore, a reaction gas is ejected through the holes 16 toward the object W during a plasma treatment process. The base 15a has its entire surface, including the inner surfaces of the through holes 16, coated with a film 15b of SiC deposited in the manner and thickness as discussed above in relation to the first embodiment. For example, a SiC film about 30 μm thick, deposited by an epitaxial growth process. The and lower open ends of each of the through holes 16 should preferably be beveled, and the diameter of each hole 16 should preferably be in the range of from about 0.3 to 1.0 mm. If the the diameter of the through holes 16 were larger than 1.0 mm, etching irregularities would be experienced, and if the diameter of the through holes 16 were smaller than 0.3 mm, it would be difficult to form through holes 16 and also to form a film of SiC on the inner surfaces of the through holes 16.

The above embodiments have been described as being applied to plasma etching apparatus. However, the electrodes of the present invention may also be employed as electrodes in plasma CVD apparatus.

An experiment was conducted on an electrode of the present invention and two conventional electrodes. The results of the experiment are given below. Advantages of the present invention will be understood from comparison of the following Inventive Example 1 and Comparative Examples 1 and 2:

Inventive Example 1

A disc-shaped electrode having a diameter of 160 mm and a thickness of 7 mm was made of carbon, and through holes each having a diameter of 0.7 mm were defined in the electrode at a spacing of 5 mm. The surface of the carbon electrode was then coated with a film of SiC having a thickness of 100 μm. The electrode was set in a plasma treatment apparatus (OAPM-406SH: manufactured by Tokyo Ohka Kogyo Co., Ltd.), and a wafer coated with a film of $SiO_2$ was etched in the apparatus under the following conditions:

R.F.: 400 kHz
Reaction gas: $C_2F_6 + CHF_3$
Output power: 500 W
Etching rate: 6000 U/min.

After 100 wafers had been etched under the above conditions, the electrode was not modified, and the surfaces of the etched films of $SiO_2$ were not contaminated.

Comparative Example 1

A carbon electrode was used to etch a coated film of $SiO_2$ on a wafer under the same conditions as those in Inventive Example 1.

While the etching rate remained unchanged, more carbon particles were emitted from the electrode as more wafers were etched. When the first wafer was etched, only about ten carbon particles were recognized, but after several hundred wafers were etched, emitted carbon particles were increased to several thousands and to several tens of thousands.

Comparative Example 2

An aluminum electrode was used to etch a coated film of $SiO_2$ on a wafer under the same conditions as those in Inventive Example 1.

After the etching process, aluminum was detected on the surface of the wafer, resulting in a deterioration of the wafer characteristics.

With the present invention, as described above, the electrode is highly durable since it is not modified or etched away to contaminate an object being treated by plasma reaction.

Although there has been described what is at present considered to be the preferred embodiment of the present invention, it will be understood that the invention may be embodied in other specific forms without departing from the essential characteristics thereof. The presently disclosed embodiments therefore, to be considered in all aspects as illustrative, and not restrictive. The scope of the invention is indicated by the appended claims rather than by the foregoing description.

We claim:

1. An electrode for use in the treatment of an object through plasma reaction, said electrode being composed of silicon carbide in its entirety:
   said electrode being of a disk shape and having a plurality of through holes defined therein for ejecting a reaction gas therethrough toward said object;
   each of said holes having a diameter ranging from 0.3 to 1.0 mm; and
   said holes are uniformly spaced at a spacing of 20 mm or less between two adjacent ones of said holes.

2. An electrode according to claim 1, wherein upper and lower ends of each of said through holes is beveled.

* * * * *

UNITED STATES PATENT AND TRADEMARK OFFICE
CERTIFICATE OF CORRECTION

PATENT NO. : 5,006,220
DATED : April 9, 1991
INVENTOR(S) : Hijikata et al.

It is certified that error appears in the above-identified patent and that said Letters Patent is hereby corrected as shown below:

Column 1, line 45 & 46, change "particle" to --particles--.

Column 2, line 22, change "A" to --As--;
         line 60, delete the comma.

Column 3, line 3, after "The" insert --upper--;
         line 43, change "U/min." to --Å/min.--.

Column 4, line 30, after "embodiments" insert --are--.

Signed and Sealed this

Eighteenth Day of August, 1992

Attest:

DOUGLAS B. COMER

*Attesting Officer*      *Acting Commissioner of Patents and Trademarks*